United States Patent
Ma et al.

(10) Patent No.: US 10,604,836 B2
(45) Date of Patent: Mar. 31, 2020

(54) METHODS FOR SURFACE PREPARATION OF SPUTTERING TARGET

(71) Applicant: Materion Corporation, Mayfield Heights, OH (US)

(72) Inventors: Longzhou Ma, Las Vegas, NV (US); Xingbo Yang, Phoenix, AZ (US); Dejan Stojakovic, Danbury, CT (US); Arthur V. Testanero, New Fairfield, CT (US); Matthew J. Komertz, New Fairfield, CT (US)

(73) Assignee: MATERION CORPORATION, Mayfield Heights, OH (US)

( * ) Notice: Subject to any disclaimer, the term of this patent is extended or adjusted under 35 U.S.C. 154(b) by 0 days.

(21) Appl. No.: 15/154,139

(22) Filed: May 13, 2016

(65) Prior Publication Data

US 2016/0333461 A1 Nov. 17, 2016

Related U.S. Application Data

(60) Provisional application No. 62/162,173, filed on May 15, 2015.

(51) Int. Cl.
*C23C 14/34* (2006.01)
*H01J 37/34* (2006.01)
(Continued)

(52) U.S. Cl.
CPC .......... *C23C 14/3414* (2013.01); *B24C 1/003* (2013.01); *B24C 1/08* (2013.01);
(Continued)

(58) Field of Classification Search
CPC .......................... C23C 14/3414; C23C 14/021
See application file for complete search history.

(56) References Cited

U.S. PATENT DOCUMENTS

| | | | | |
|---|---|---|---|---|
| 5,145,717 A | * | 9/1992 | Drury | ............... B24C 1/04 427/271 |
| 5,415,584 A | * | 5/1995 | Brooke | ............... B08B 7/00 134/7 |

(Continued)

FOREIGN PATENT DOCUMENTS

| CN | 1768157 A | 5/2006 |
|---|---|---|
| CN | 101509127 A | 8/2009 |

(Continued)

OTHER PUBLICATIONS

International Search Report and Written Opinion for International Application No. PCT/US2016/032370 dated Nov. 24, 2016.

(Continued)

*Primary Examiner* — Jason Berman
(74) *Attorney, Agent, or Firm* — Fay Sharpe LLP

(57) ABSTRACT

Methods for finishing a sputtering target to reduce particulation and to reduce burn-in time are disclosed. The surface of the unfinished sputtering target is blasted with beads to remove machining-induced defects. Additional post-processing steps include dust blowing-off, surface wiping, dry ice blasting, removing moisture using hot air gun, and annealing, resulting in a homogeneous, ultra-clean, residual-stress-free, hydrocarbon chemicals-free surface.

11 Claims, 13 Drawing Sheets

(51) Int. Cl.
  *B24C 1/00* (2006.01)
  *B24C 11/00* (2006.01)
  *B24C 1/08* (2006.01)
  *C23C 14/02* (2006.01)

(52) U.S. Cl.
  CPC ............ *B24C 11/00* (2013.01); *C23C 14/021* (2013.01); *H01J 37/3426* (2013.01); *H01J 37/3491* (2013.01)

(56) References Cited

U.S. PATENT DOCUMENTS

| | | | |
|---|---|---|---|
| 5,632,869 A | 5/1997 | Hurwitt et al. | |
| 6,030,514 A | 2/2000 | Dunlop et al. | |
| 6,074,279 A | 6/2000 | Yoshimura et al. | |
| 6,106,681 A * | 8/2000 | Saito | C23C 14/086 134/1 |
| 2002/0185372 A1 * | 12/2002 | Hunt | C23C 14/3407 204/298.12 |
| 2003/0019746 A1 | 1/2003 | Ford | |
| 2003/0226402 A1 | 12/2003 | Leybovich | |
| 2004/0035146 A1 * | 2/2004 | Dannings | F17C 7/00 62/605 |
| 2007/0215463 A1 | 9/2007 | Parkhe | |
| 2009/0045044 A1 | 2/2009 | Akins et al. | |
| 2010/0107982 A1 | 5/2010 | Sato et al. | |

FOREIGN PATENT DOCUMENTS

| | | |
|---|---|---|
| DE | 19621580 A1 | 12/1996 |
| JP | 2002/030431 A | 1/2002 |
| JP | 2012 107277 A | 6/2012 |
| WO | WO 2008/081585 | 7/2008 |
| WO | WO 2011/144759 A1 | 11/2011 |
| WO | WO 2013/070679 A1 | 5/2013 |
| WO | WO 2015/061035 A1 | 4/2015 |

OTHER PUBLICATIONS

Singapore Search Report for SG Application No. 11201709416Q dated Oct. 23, 2018.

* cited by examiner

METHODS FOR SURFACE PREPARATION OF SPUTTERING TARGET

CROSS-REFERENCE TO RELATED APPLICATIONS

This application claims priority to U.S. Provisional Patent Application Ser. No. 62/162,173, filed May 15, 2015, the entirety of which is hereby incorporated by reference.

BACKGROUND

The present disclosure relates to methods for processing a sputtering target to obtain a sputtering target that has reduced particulation during sputtering and needs less burn-in time for optimum operation. The sputtering targets themselves, as well as methods for producing such targets, are also disclosed.

Sputtering is used to deposit a source material in the form of a thin film onto a substrate (e.g., in micro-electronics applications). The source material to be deposited is formed into a sputtering target with either rectangular or round shape or other geometrical shapes. The sputtering target is then bombarded with a beam of energetic particles (e.g., an ion beam or a plasma beam) in a controlled environment. Atoms of the source material are ejected from the sputtering target and deposited onto the substrate to form a thin film (e.g., a semiconductor wafer).

The procedure for forming a sputtering target with the desired dimensions and geometrical shape usually involves various mechanical machining steps (e.g. grinding, turning) that are very likely to introduce surface defects onto the sputtering target (e.g., cracks, contaminations and machining scratches, etc.). For example, operations such as lathing, milling, and grinding use extensive forces on the exterior surfaces of the sputtering target to cut/remove materials and form the desired shape and dimensions with high precision. Also, in order to avoid temperature increases of the work piece, various lubricants or coolants have to be used during machining. Surface defects such as grinding lines, scratches, embedded impurities, and contaminations are usually unavoidably present on the final finished surface of the sputtering target after machining. These surface defects cause undesirably high levels of initial particulation during sputtering. Particulation of a sputtering target refers to large particles being ejected from the surface of the sputtering target, rather than individual atoms/ions, and landing on the wafer. These particles can be considered to be contaminants because they affect and reduce device yield due to the resulting particle defects formed on the substrate. Particulation can also result in formation of nodules on the substrate, which has pronounced effects on the properties of the thin film.

The condition of the surface of the sputtering target, surface residual stress, and local density variations affect the occurrence of particulation. A smooth, defect-free, residual stress-free and contamination-free (i.e. clean) surface is desired for reducing initial particulation of a sputtering target.

A burn-in or preconditioning step may be used to remove any surface defects prior to using the sputtering target for material deposition on a substrate. During the burn-in step, the sputtering chamber cannot be used for production. This makes the burn-in process expensive in terms of both time and money. Reducing the preconditioning or burn-in time would result in savings and a reduction in ownership costs. Because it is common in the semiconductor industry to use a cluster of sputtering tools for continuous production, reducing particulation and minimizing burn-in time are both vital for highly efficient production.

BRIEF DESCRIPTION

The present disclosure relates to methods for finishing sputtering targets. Very generally, after an intermediate sputtering target is formed, the main surface of the intermediate sputtering target (which will be used for sputtering) is then blasted with beads and/or surface polished (e.g., using orbital sanding) to remove any manufacturing defects from the surface. Following bead blasting and/or surface polishing, a series of cleaning processes such as dust blowing-off, surface wiping, dry ice blasting, and moisture removal can be carried out to remove any blasting-induced dirt, impurities, or possibly any beads which are now embedded in the surface of the sputtering target. Finally, the target can be annealed to remove the surface residual stress. This process results in a finished sputtering target that has homogeneous surface structure, is contamination-free, and is free of residual stresses. This is useful for thin film manufacturing, which is also useful in STT-RAM (spin transfer torque random access memory) technology to build magnetic tunnel junctions (MTJ).

The sputtering targets in this disclosure may be made from metals such as tantalum (Ta), iridium (Ir), cobalt (Co), ruthenium (Ru), tungsten (W), or an iron-cobalt-boron (Fe-CoB) series alloy, or may be made from ceramics such as magnesium oxide (MgO). In particular embodiments, the sputtering target comprises an alloy selected from the group consisting of $Fe_xCo_yB_{10}$, $Fe_xCo_yB_{20}$, $Fe_xCo_yB_{30}$. Here, the numbers refer to the atomic fraction of each element. The values for x and y can independently be from 0.05 to 0.75. In some embodiments, x=y.

The beads may comprise zirconia or silica. In desirable embodiments, the beads are in the form of a powder composed of finely divided spherical particles with high wear resistance, high fracture roughness, smooth surface, good roundness, and narrow size distribution. In particular embodiments, the beads have an average diameter of about 10 micrometers (μm) to about 100 μm.

The blasting may be performed using compressed air at a pressure from about 60 psi to about 100 psi (0.34-0.69 MPa). The distance between the blasting nozzle and the target surface may be from about 40 mm to about 100 mm. The angle between the blasting nozzle and the target surface may range from about 5° to about 45°. The blasting time period may vary with the pressure of the compressed air and the surface hardness of the blasting beads, and usually ranges from about 0.05 to about 2.0 seconds/$cm^2$ of the sputtering target surface. The amount of the sputtering target surface that needs to be blasted may be determined by visual inspection of the surface. A homogeneous surface usually shows a homogeneous contrast under a regular light illumination. The blasting may be performed a temperature of about 25° C. to about 35° C. During blasting, the blasting nozzle may move across the sputtering target, and/or the sputtering target maybe rotated to uniformly blast the surface. The process can be repeated in order to obtain a uniform sputtering target surface.

The surface of the unfinished sputtering target may be formed by surface grinding, lathing, and milling prior to the blasting.

While bead blasting can remove surface defects such as contaminants, cracks, and scratches caused by machining, post-processing steps are very helpful in obtaining a clean and residual-stress-free surface that is important for reducing particulation during sputtering. Such post-processing steps may include blowing dust off the surface using compressed air; surface wiping with an organic solvent like methanol or ethanol; blasting the surface with dry ice (solid $CO_2$) at a pressure of about 30 psi to about 80 psi (0.21-0.55 MPa), at a dry ice feed speed of 10-30 lb/min; moisture removal using a hot air gun at a temperature of about 60° C. to about 120° C.; and annealing with gas protection or under vacuum in order to obtain a surface that is free of dust, moisture and residual stress.

These and other non-limiting characteristics of the disclosure are more particularly disclosed below.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The following is a brief description of the drawings, which are presented for the purposes of illustrating the exemplary embodiments disclosed herein and not for the purposes of limiting the same.

DETAILED DESCRIPTION

Figure 1:
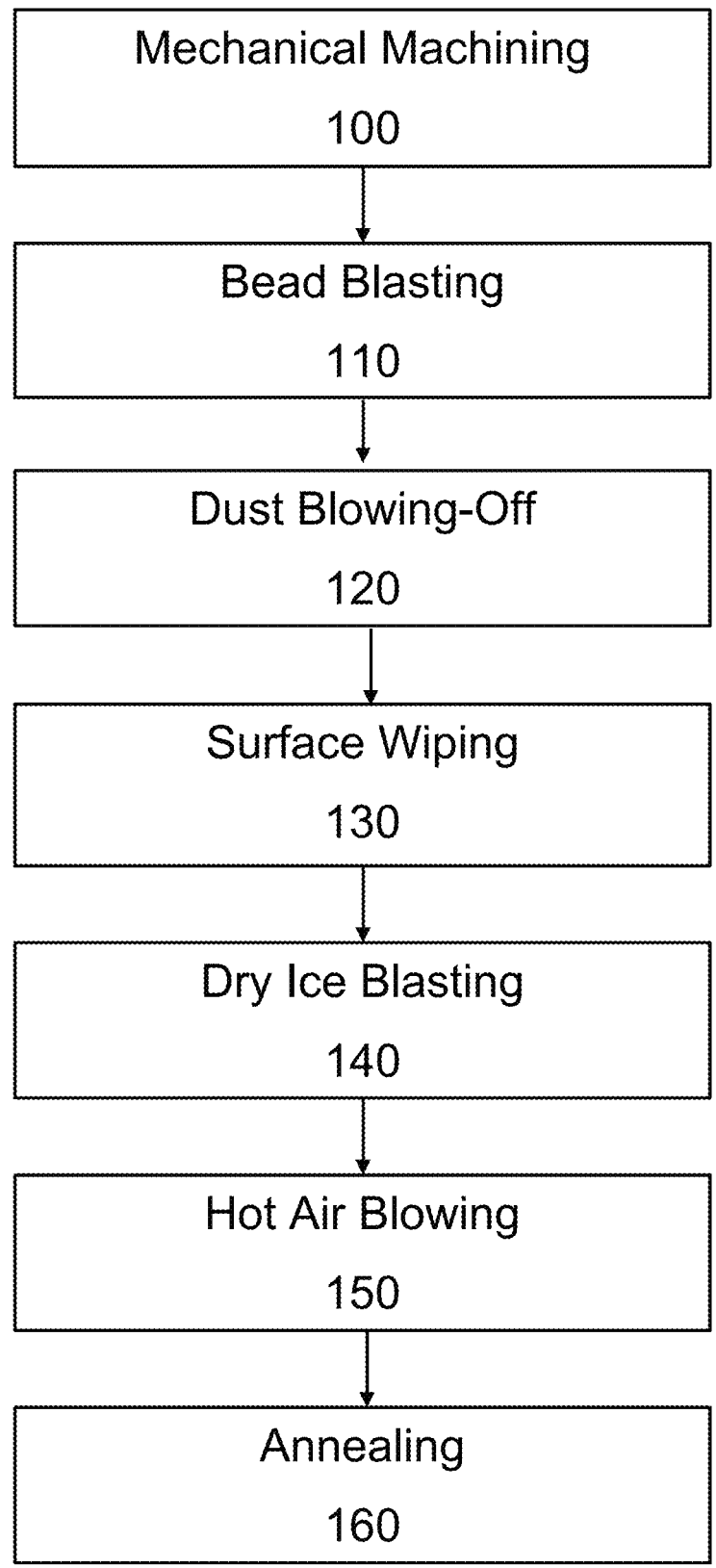
FIG. 1 is a flow chart illustrating an exemplary method for producing a sputtering target in accordance with embodiments of the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named components/steps and permit the presence of other components/steps. However, such description should be construed as also describing compositions or processes as "consisting of" and "consisting essentially of" the enumerated components/steps, which allows the presence of only the named components/steps, along with any impurities that might result therefrom, and excludes other components/steps.

Numerical values in the specification and claims of this application should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 to 10" is inclusive of the endpoints, 2 and 10, and all the intermediate values).

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to methods for finishing sputtering targets. The methods include bead blasting the as-machined surface of a sputtering target. The surface being referred to herein is the surface of the sputtering target that will be contacted by a beam of energetic particles, and from which atoms or ions will be ejected to be deposited on a desired substrate. Additional post-processing steps can include dust blowing-off, surface wiping, dry ice blasting, moisture removal, and annealing. These surface treatments may reduce undesirable particulation and/or preconditioning time (also known as burn-in time) of the sputtering target.

The sputtering targets themselves are made of a material that is desired to be deposited upon a substrate. In particular embodiments, such source materials for the sputtering target may include ruthenium, magnesium oxide, and/or an iron-boron-cobalt alloy.

FIG. 1 illustrates an exemplary embodiment of a method disclosed herein for forming a sputtering target according to the present disclosure. In step 100, the sputtering target is mechanically machined. Machining steps include lathing, milling, or grinding to form a sputtering target having a desired shape, dimensions, and intermediate roughness. Due to the machining, surface defects are present on the surface of the sputtering target. In step 110, the surface of the sputtering target is processed by bead blasting to remove surface defects. In step 120, the blasted surface is blown with compressed air to remove dust that may be left over after bead blasting. The surface is then wiped in step 130 to further remove any dust on the surface of the sputtering target. In step 140, dry ice (solid $CO_2$) blasting is used to further clean the surface after bead blasting, dust blowing-off, and surface wiping. Following step 140, step 150 is using hot air on the surface of the sputtering target to evaporate and remove any moisture from the processed surface of the sputtering target. The surface may be inspected after hot air blowing 150. After step 150, step 160 is to conduct an annealing to remove surface residual stress of the sputtering target. Surface annealing may be performed to obtain a residual-stress-free surface.

In step 110, the beads can be made of any material that is chemically inert (i.e. will not react with the sputtering target). Desirably, the beads are spherical with high fracture toughness, good wearing resistance, and good roundness. Usually metallic oxides such as zirconia, silica, alumina, etc. are good candidates for bead mead materials. In particular embodiments, the beads that are used to blast the surface of the sputtering target may be zirconia beads or alumina beads or silica beads. In some embodiments, the beads are spherical with average diameter of about 10 micrometers (µm) to about 100 µm. The beads should exhibit high wear-resistance, high fracture toughness, and good roundness, so that they can be reused.

The bead blasting may be performed using any commercially available blasting apparatus, such as a Skat Dry Blast System, manufactured by Skat Blast Inc., Canfield, Ohio. The blasting may be performed using compressed air or argon at a pressure from about 60 psi to about 100 psi (0.34-0.69 MPa). The distance between the blasting nozzle and the target surface may be from about 5 mm to about 100 mm, including about 40 mm to about 100 mm. The angle between the blasting nozzle and the target surface may range from about 5° to about 45°. The blasting time period may vary with the pressure of the compressed air and the surface hardness of the blasting beads, and usually ranges from about 0.05 to about 2.0 seconds/cm$^2$ of the sputtering target surface. The amount of the sputtering target surface that needs to be blasted may be determined by visual inspection of the surface. A homogeneous surface usually shows a homogeneous contrast under a regular light illumination. The blasting may be performed at a temperature of about 20° C. to about 35° C., or more preferably about 23° C. to about 30° C. During blasting, the blasting nozzle may move across the sputtering target, and/or the sputtering target maybe rotated to uniformly blast the surface.

The surface wiping 130 is performed using wiping paper that has been wetted with a solvent having a low vapor pressure. Exemplary solvents include methanol, ethanol, and acetone.

The dry ice blasting 140 can be performed using an I$^3$MicroClean system, manufactured by Cold Jet, LLC. The dry ice blasting can be performed at a pressure of about 30 psi to about 80 psi. The dry ice may be fed into the system at a rate of about 10 to about 30 lb/min.

As a result of these processes, any surface defects on the sputtering target can be removed, forming a clean, homogeneous and residual stress-free surface. In some embodiments, the thickness of the sputtering target can be kept unchanged, or a negligible thickness reduction occurs in some embodiments after the processing steps.

The resulting sputtering target is expected to reduce particulation during sputtering. In some embodiments, there are about 100 particles or less in the 0.1 µm to 1 µm size range on the surface. The surface of the sputtering target is also more homogeneous and clean. In some embodiments, no particles having a size larger than 200 nm were detected.

The following examples are provided to illustrate the articles, processes and properties of the present disclosure. The examples are merely illustrative and are not intended to limit the disclosure to the materials, conditions, or process parameters set forth therein.

EXAMPLES

Example 1: Hot Pressed Ruthenium (Ru) Target

A ruthenium (Ru) sputtering target with diameter of 165 mm and thickness of 3.8 mm was sintered and then subjected to a mechanical machining and mechanical grinding step. This was followed by bead blasting with spherical zirconia beads.

Figure 2A:
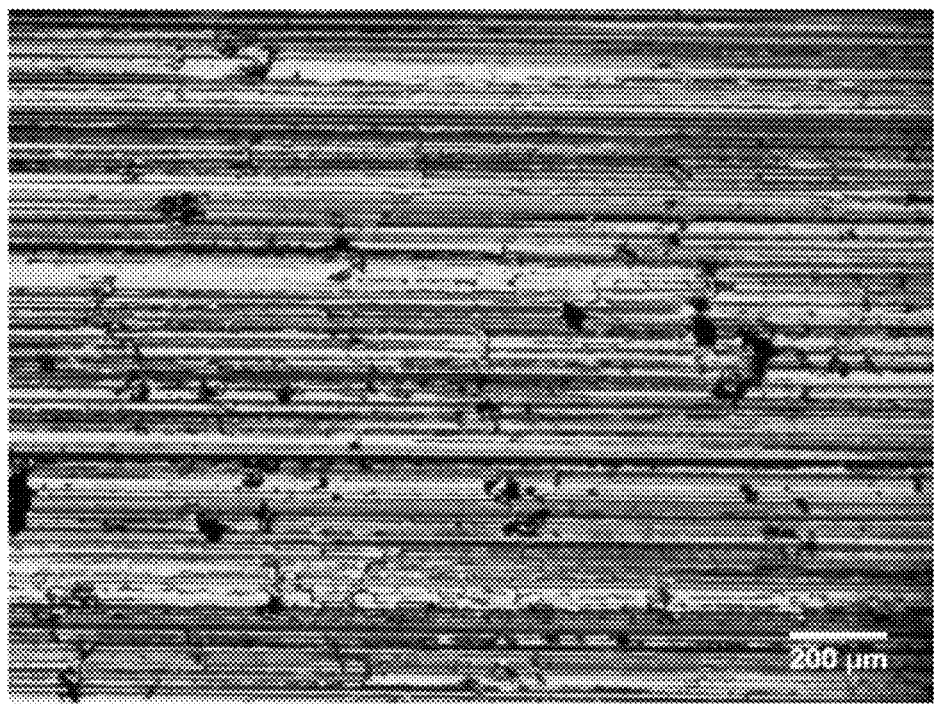
FIG. 2A is an optical micrograph of the as-machined surface of a ruthenium (Ru) sputtering target prior to a bead blasting treatment.

FIG. 2A is an optical micrograph of the sputtering target surface after machining, i.e. prior to bead blasting. Grinding-induced defects such as surface micro cracks, grinding marks, contamination, and other surface defects were observed on the as-ground surface. The surface roughness after grinding was anisotropic. In the direction parallel to the grinding direction, the surface roughness was 3-7 Ra, however, the surface roughness was 8-12 Ra in the direction transverse to the grinding direction.

Figure 2B:
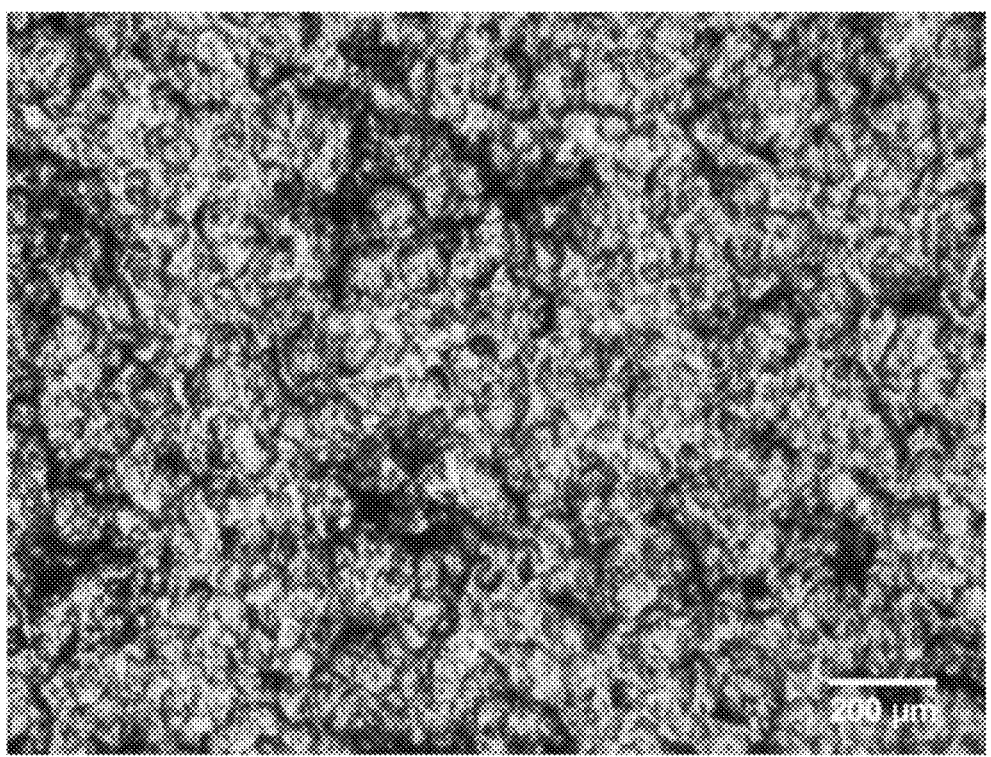
FIG. 2B is an optical micrograph of the surface of the ruthenium (Ru) sputtering target after a bead blasting treatment according to the present disclosure.

FIG. 2B is an optical micrograph of the sputtering target surface after bead blasting. The grinding-induced defects were removed by the bead blasting. A homogeneous and clean surface was also observed after blasting. The surface roughness is 15-18 Ra in the direction parallel to grinding, and 15-17 Ra in the direction transverse to grinding. While the surface roughness slightly increased after bead blasting, the surface roughness was more homogeneous.

Figure 2C:
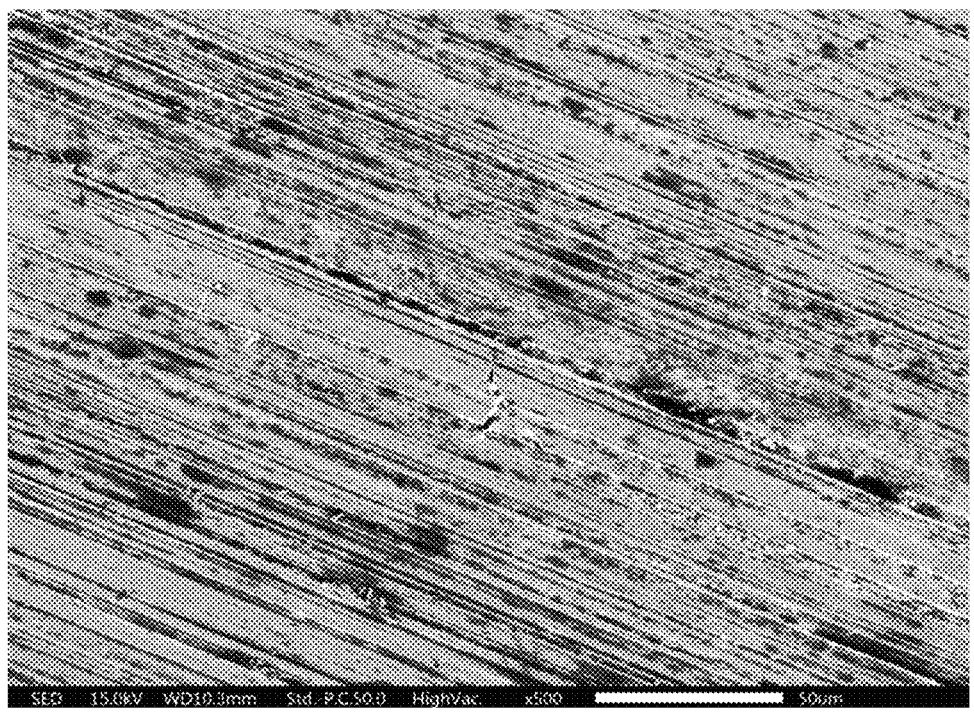
FIG. 2C is an SEM (scanning electron microscopy) secondary electron image micrograph of the as-ground surface of the ruthenium (Ru) sputtering target prior to a bead blasting treatment according to the present disclosure.

FIG. 2C is an SEM secondary electron image micrograph of the as-ground surface of a ruthenium (Ru) sputtering target prior to a bead blasting treatment. Grinding-induced defects such as cracks, scratch lines, and contamination were evident, and the structure of the surface was visibly anisotropic.

Figure 2D:
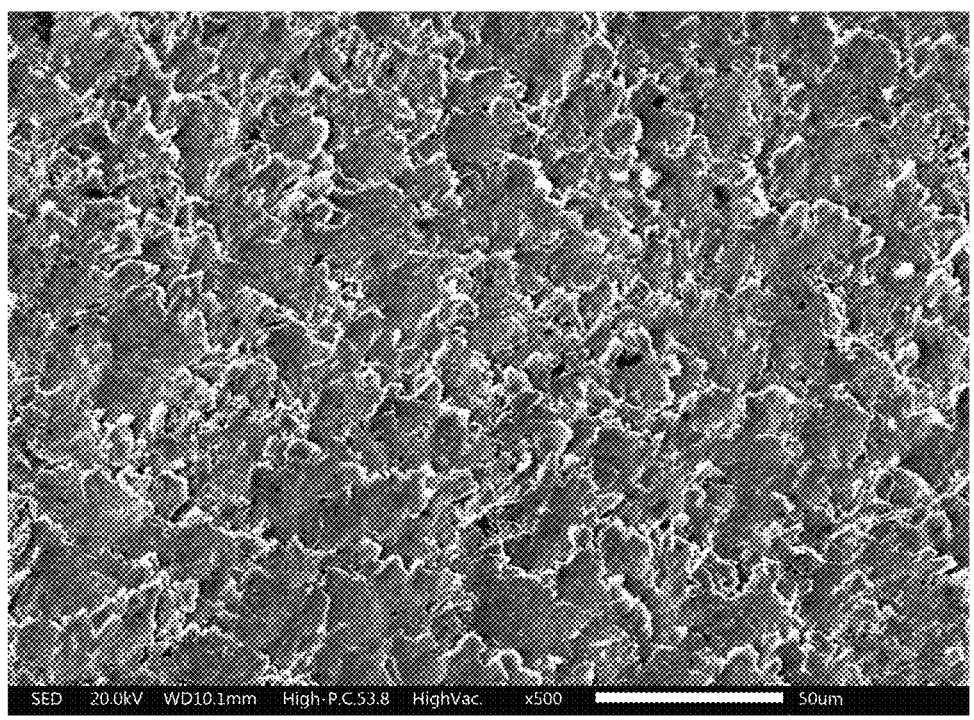
FIG. 2D is an SEM secondary electron image micrograph of the surface of the ruthenium (Ru) sputtering target subjected to a bead blasting, dust blowing-off, surface wiping, and dry ice treatment according to the present disclosure.

FIG. 2D is an SEM secondary electron image micrograph of the surface of a ruthenium (Ru) sputtering target after being subjected to bead blasting, dust blowing-off, surface wiping, and dry ice blasting according to the present disclosure, showing a homogeneous surface structure and elimination of grinding-induced defects.

Figure 2E:
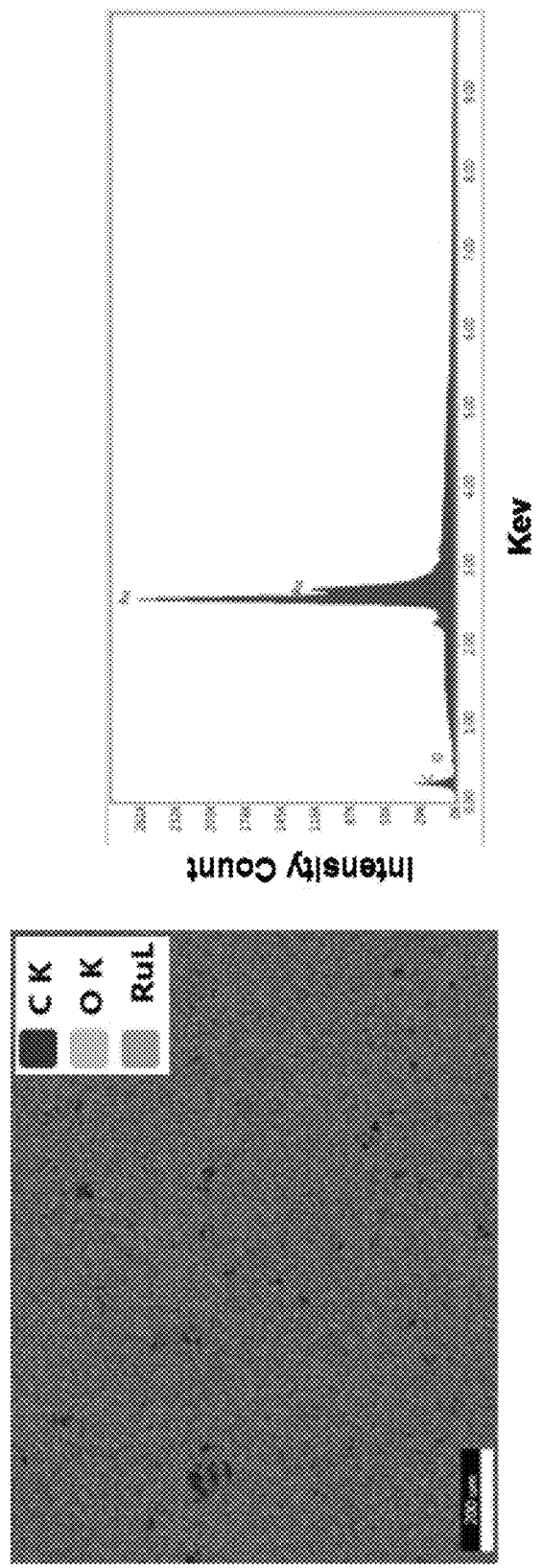
FIG. 2E is an SEM EDX (energy dispersive X-ray spectroscopy) micrograph with elemental mapping (left side) and an EDX spectrum (right side) of the ruthenium (Ru) sputtering target subjected to bead blasting, dust blowing-off, surface wiping, and dry ice blasting according to the present disclosure. For the EDX spectrum, the y-axis is the intensity count and runs from 0 to 261K in intervals of 29K, and the x-axis is Kev and runs from 0.00 to 9.00 in intervals of 1.00.

FIG. 2E is a SEM EDX micrograph of the Ru sputtering target surface subjected to bead blasting, dust blasting, surface wiping and dry ice blasting. The left side is an elemental map, and the right side is the EDX spectrum. Both show pure Ru peaks with negligible C and O signals. The C and O signals might have arisen from background noise. Together, the micrograph suggests the post-processing steps result in a clean surface with minimal impurities and contamination.

Figure 2F:
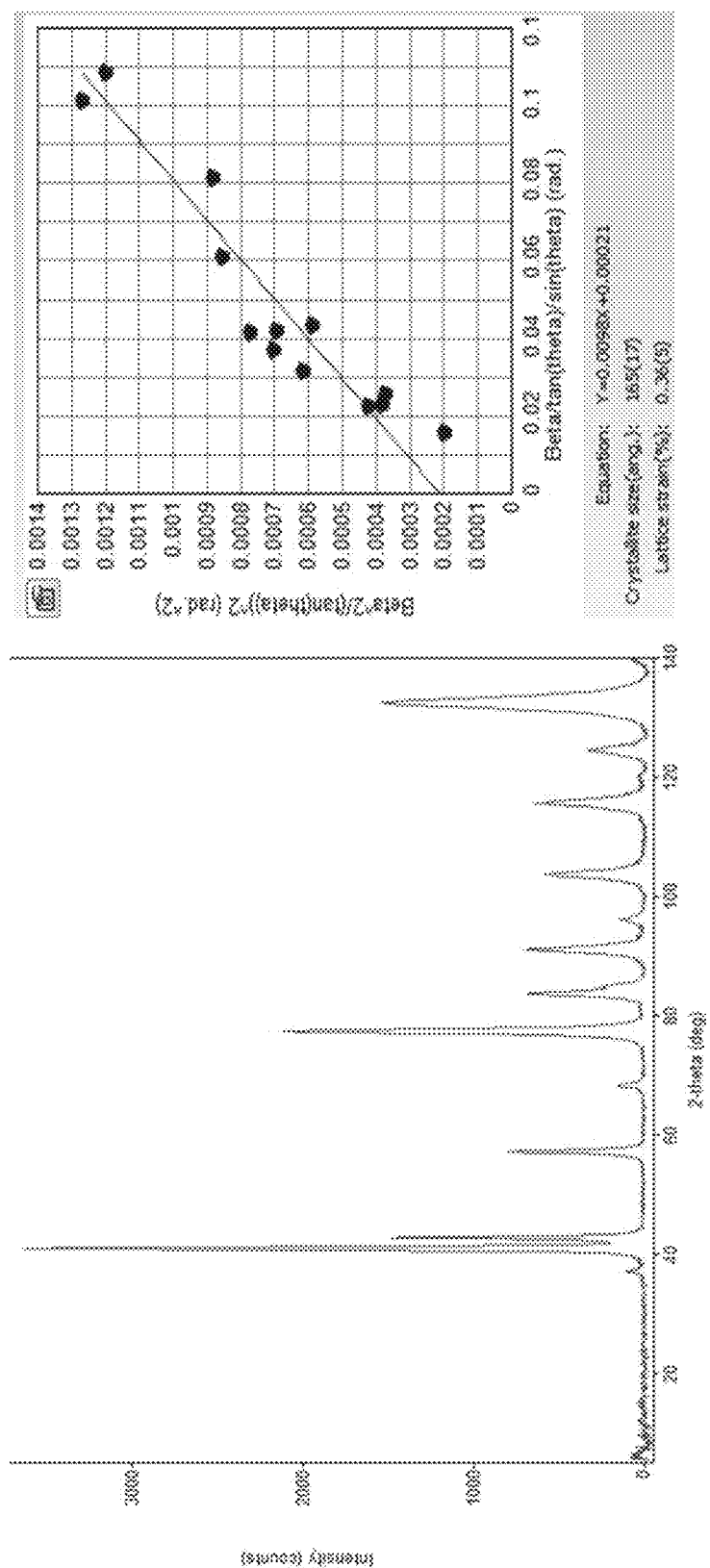
FIG. 2F is an XRD(X-ray diffraction) plot (left side) and residual stress processing (right side) for the surface of a ruthenium (Ru) sputtering target after a bead blasting, dust blowing-off, surface wiping, and dry-ice blasting treatment without annealing according to the present disclosure. For the XRD plot, the y-axis is the intensity count and runs from 0 to 3000 in intervals of 1000, and the x-axis is the 2-theta in degrees, and runs from 20 to 140 in intervals of 20. For the residual stress plot on the right side, the y-axis runs from 0 to 0.0014 in intervals of 0.0001, and the x-axis runs from 0 to 0.12 in intervals of 0.02.

FIG. 2F shows the results of XRD (X-ray diffraction) measurement of the surface of a ruthenium (Ru) sputtering target after bead blasting, dust blowing-off, surface wiping and dry-ice blasting treatment without annealing. The X-ray diffraction spectrum (left side) and residual stress processing (right side) showed a marked peak broadening and crystal strain of 0.36%. The results suggested that surface residual stress was present after surface processing without annealing.

Figure 2G:
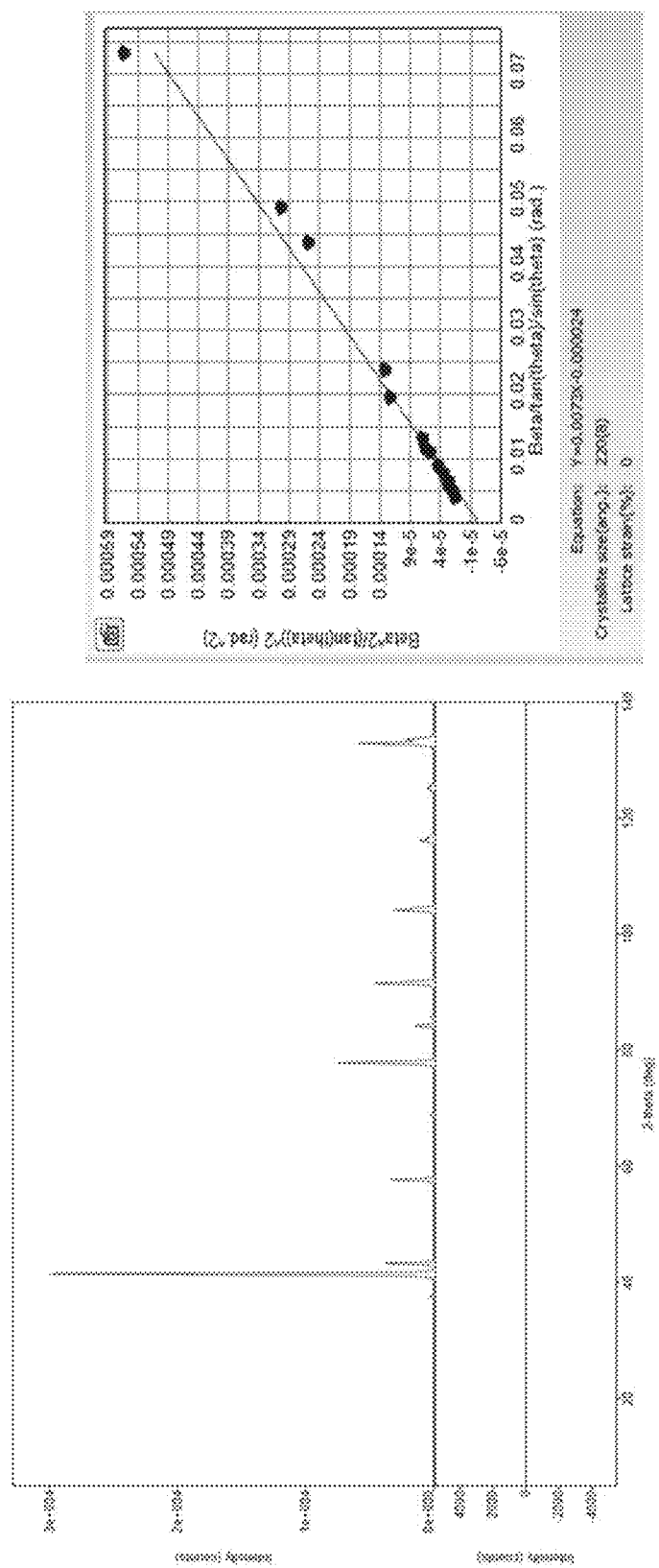
FIG. 2G is an XRD plot (left side) and residual stress processing (right side) for the surface of a ruthenium (Ru) sputtering target after a bead blasting, dust blowing-off, surface wiping, and dry-ice blasting treatment with annealing according to the present disclosure. For the XRD plot, the y-axis is the intensity count and has two different series. The first series on the bottom runs from −4000 to 4000 in intervals of 1000. The second series on the top of the y-axis runs from 0 to 3e+004 in intervals of 1e+004. The x-axis is the 2-theta in degrees, and runs from 20 to 140 in intervals of 20. For the residual stress plot on the right side, the y-axis runs from −6e-5 to 9e-5 in intervals of 5e-5, then from 0.00014 to 0.00059 in intervals of 0.00005, and the x-axis runs from 0 to 0.07 in intervals of 0.01.

FIG. 2G shows the results of XRD (X-ray diffraction) measurement of the surface of a ruthenium (Ru) sputtering target after bead blasting, dust blowing-off, surface wiping and dry-ice blasting treatment, and following annealing at 1050° C. for 3 hours under vacuum. The X-ray diffraction spectrum (left side) and residual stress processing (right side) show a well-defined XRD spectrum and crystal strain of 0%. The results suggested that surface residual stress was removed by annealing. The resulting sputtering target was installed in a sputtering system for a production run, and almost no particle having a size of greater than 200 nm was detected on the sputtering target surface.

Example 2: Cast Iron-Boron-Cobalt ($Fe_xCo_yB_{20}$) Target

An iron-cobalt-boron ($Fe_xCo_yB_{20}$) sputtering target with 150 mm diameter and thickness of 5.0 mm was produced via VIM (vacuum induction melting) casting, then subjected to a mechanical grinding step followed by bead blasting with zirconia beads.

Figure 3A:
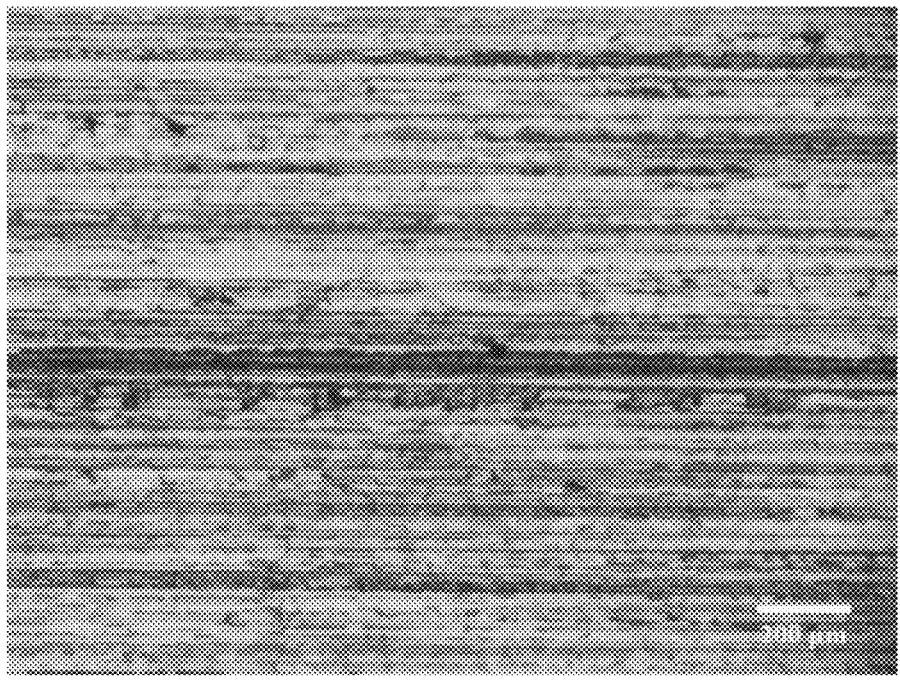
FIG. 3A is a micrograph of the as-machined surface of an iron-cobalt-boron ($Fe_xCo_yB_{20}$) alloy sputtering target prior to the bead blasting treatment according to the present disclosure.

FIG. 3A is an optical micrograph of the sputtering target surface after mechanical grinding but prior to bead blasting. Grinding-induced defects such as surface micro cracks, grinding marks, and contamination were observed on the as-ground surface.

Figure 3B:
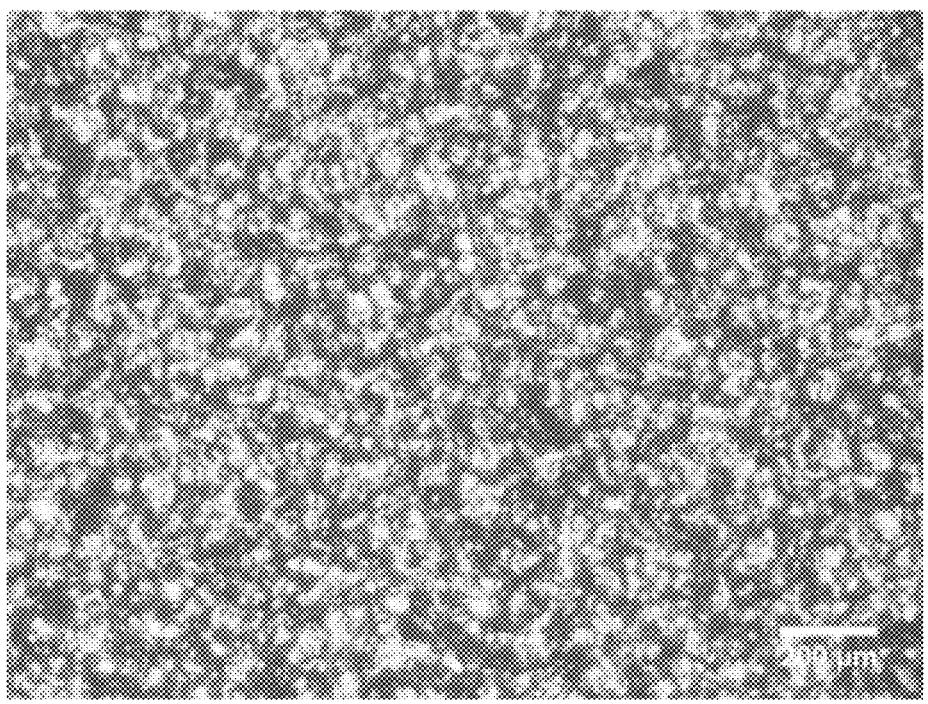
FIG. 3B is a micrograph of the surface of the iron-cobalt-boron ($Fe_xCo_yB_{20}$) alloy sputtering target after the bead blasting treatment according to the present disclosure.

FIG. 3B is an optical micrograph of the sputtering target surface after bead blasting, dust blowing-off and surface wiping. The grinding-induced defects were removed by the bead blasting. A homogeneous and clean surface was observed after bead blasting. The cast sputtering target of $Fe_xCo_yB_{20}$ alloy exhibited high density and high hardness (55-66 HRC). After bead blasting, there were less than 100 particles in the range of from 0.1 μm to 1 μm during sputtering. The surface roughness of the $Fe_xCo_yB_{20}$ target after bead blasting, dust blowing-off, and surface wiping was 14-30 Ra.

Example 3: MgO-Sputtering Target

A magnesium oxide (MgO) sputtering target produced via sintering with a diameter of 175 mm and thickness of 5 mm was subjected to a mechanical grinding step followed by bead blasting with spherical zirconia beads.

Figure 4A:
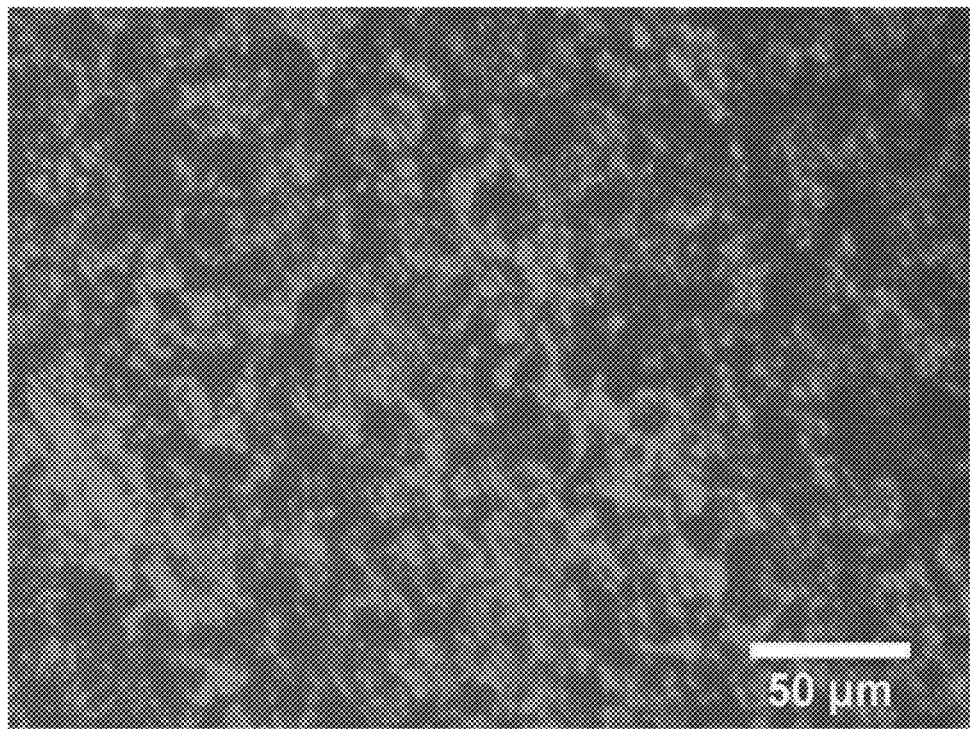
FIG. 4A is a micrograph of the as-machined surface of a ceramic magnesium oxide (MgO) sputtering target prior to a bead blasting treatment according to the present disclosure.

FIG. 4A is an optical micrograph of the sputtering target surface after mechanical machining. Machining-induced micro cracks and clustered MgO particles are observed. The surface roughness was 31-37 Ra in the direction parallel to the grinding lines, and 35-39 Ra in the direction perpendicular to the grinding lines.

Figure 4B:
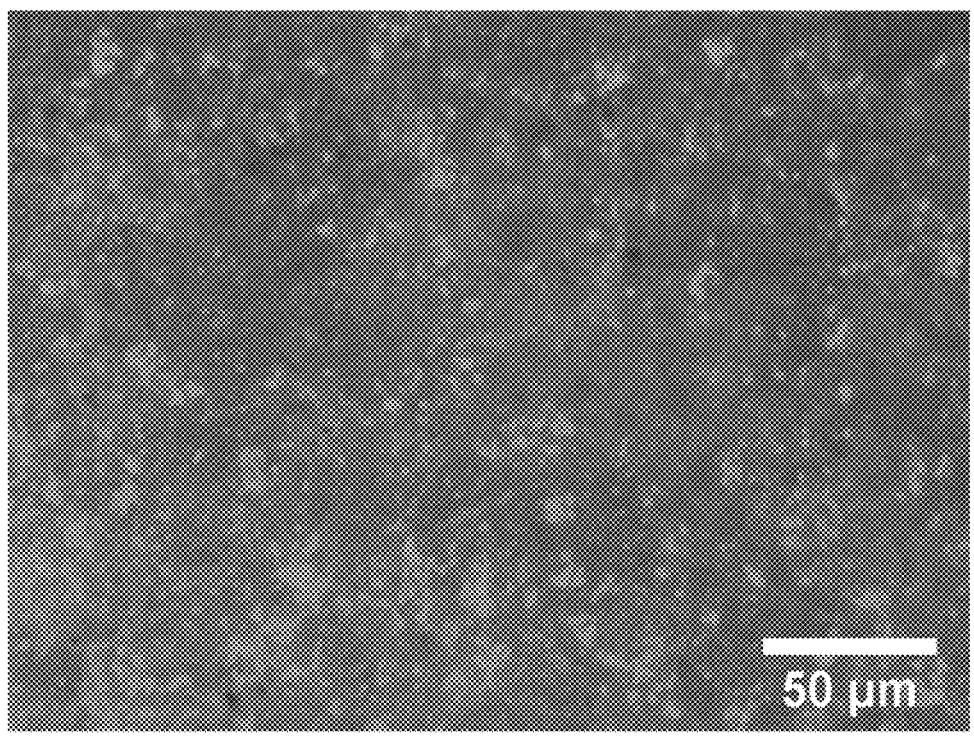
FIG. 4B is a micrograph of the surface of a ceramic magnesium oxide (MgO) sputtering target after a bead blasting treatment according to the present disclosure.

FIG. 4B is an optical micrograph of the sputtering target surface after bead blasting. The surface roughness became isotropic (around 98-126 Ra) in two cross directions. While the surface roughness increased after bead blasting, the machining-induced lines were removed by the bead blasting. Clustered and loosely bonded particles have also been wiped off. Such surface structure and features are thought to be beneficial to reduce initial particulation. A relatively homogeneous surface structure with minimized contamination was observed after bead blasting.

Example 4: Pure Cobalt Target

Figure 5:
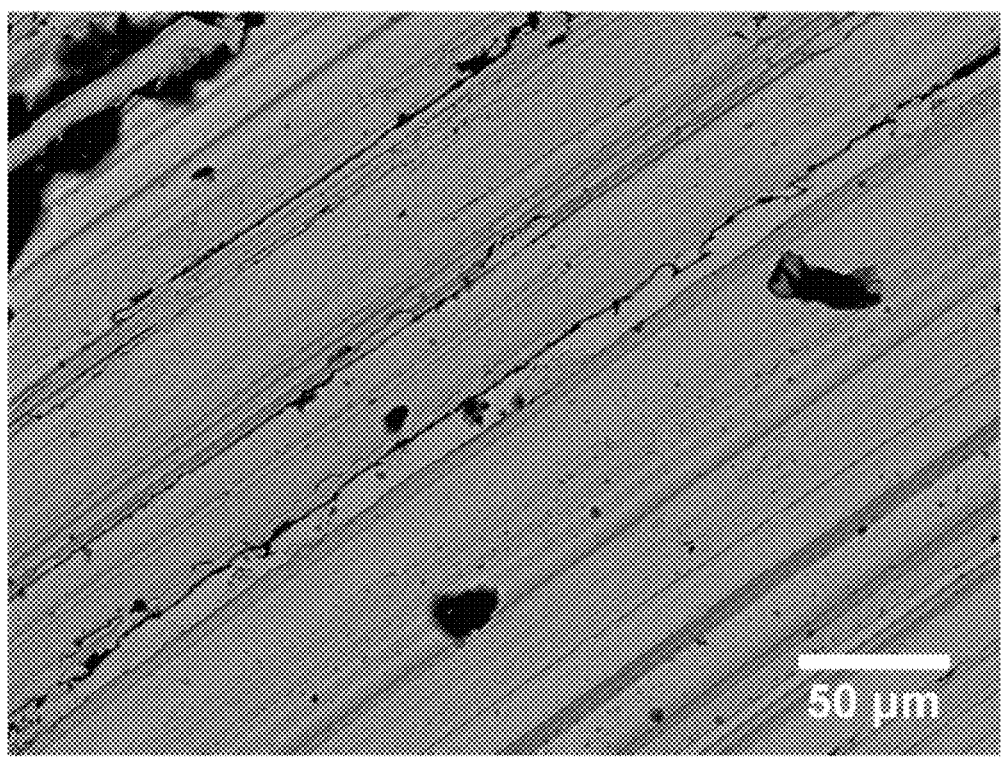
FIG. 5 is a micrograph of the as-machined cobalt target of Example 4.
Figure 6A:
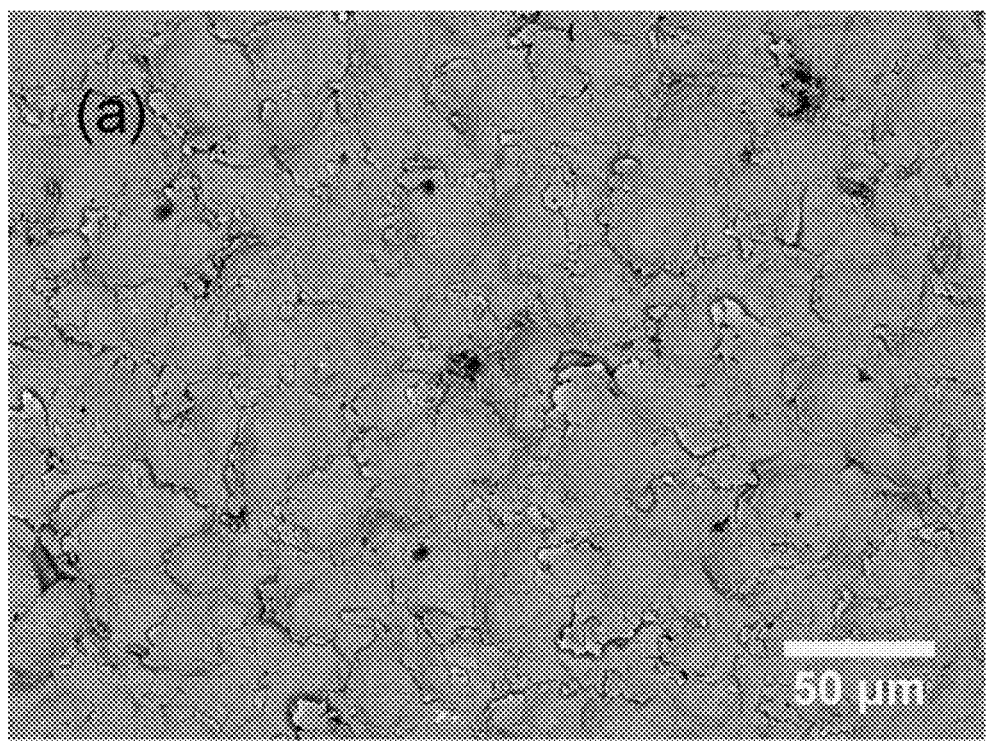
FIG. 6A is a micrograph of the cobalt target of FIG. 5 after bead blasting.
Figure 6B:
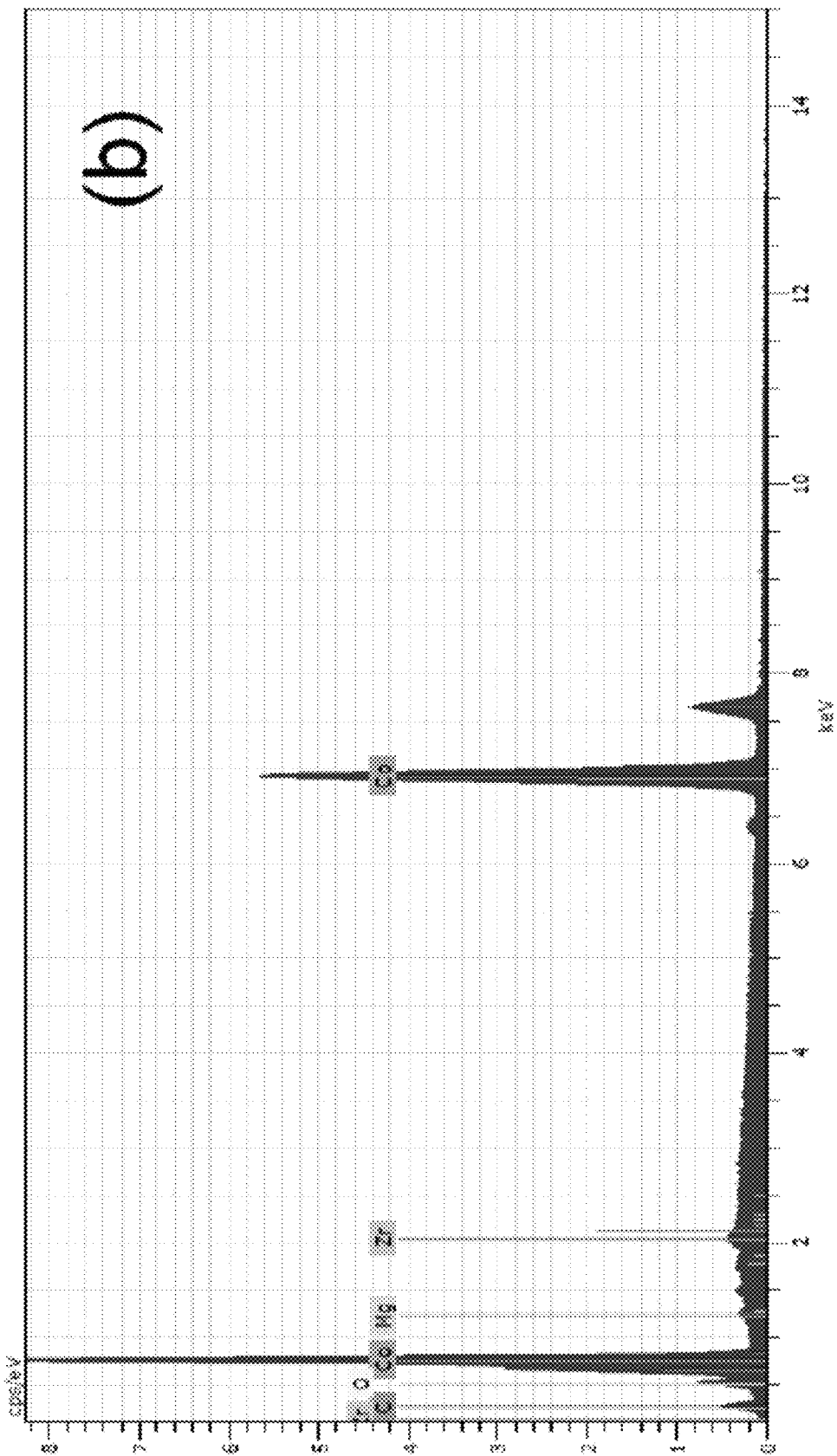
FIG. 6B is an EDX spectrum of the target of FIG. 6A. The y-axis is cps/eV, and runs from 0 to 8 in intervals of 1. The x-axis is keV, and runs from 0 to 14 in intervals of 2.
Figure 7A:
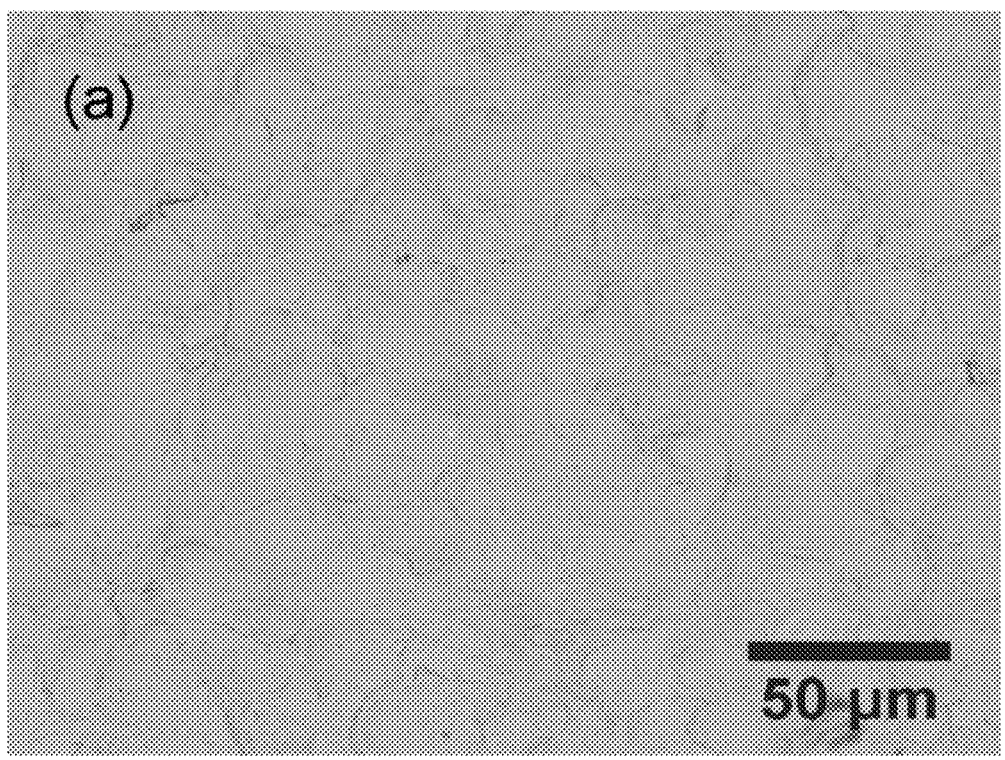
FIG. 7A is a micrograph of the cobalt target after the surface treatment of Example 4.
Figure 7B:
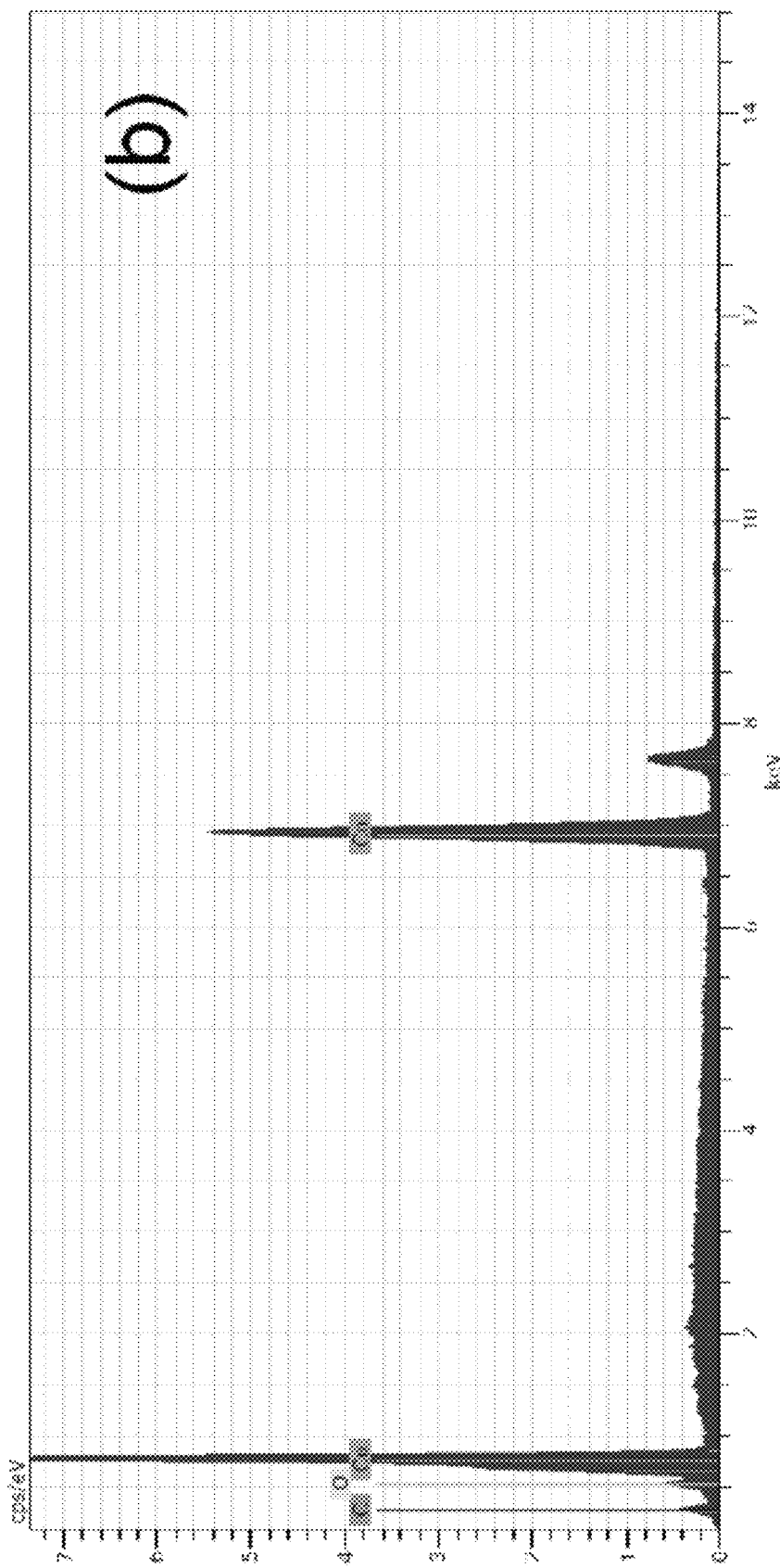
FIG. 7B is an EDX spectrum of the target of FIG. 7A. The y-axis is cps/eV, and runs from 0 to 7 in intervals of 1. The x-axis is keV, and runs from 0 to 14 in intervals of 2.

Targets of pure cobalt (Co) with 99.95% purity and a diameter of 3.5 inches were subjected to surface treatment. SEM analysis was conducted indifferent steps to illustrate the effects of surface treatment on surface structure and cleanliness. As expected, the initial surface of the Co target showed numerous machining-induced scratch lines, damage pits, and contaminations after machining, as shown in FIG. 5. After bead blasting treatment, the scratch lines could be eliminated, and the resulting surface structure was very random and homogeneous, as shown in FIG. 6A. Only a few specks of dusts or bead-blasting-induced contaminations such as Zr peak were detected by EDX as shown in FIG. 6B. The surface contamination or entrapped dust could be eliminated via dry ice blasting and surface heating by hot air gun. As shown in FIG. 7A and FIG. 7B, the pure Co spectrum was found together with trace level C/O residual peak, which was related to noise and background from the sample holder. This example shows that the surface treatment could remove the machining-induced damage layer, homogenize the surface structure and remove contamination from the target surface. Such surface structure is thought to be beneficial to reduce particulation and burning-in time.

Example 5: $Fe_xCo_yB_{40}$ Alloy Target

Figure 8:
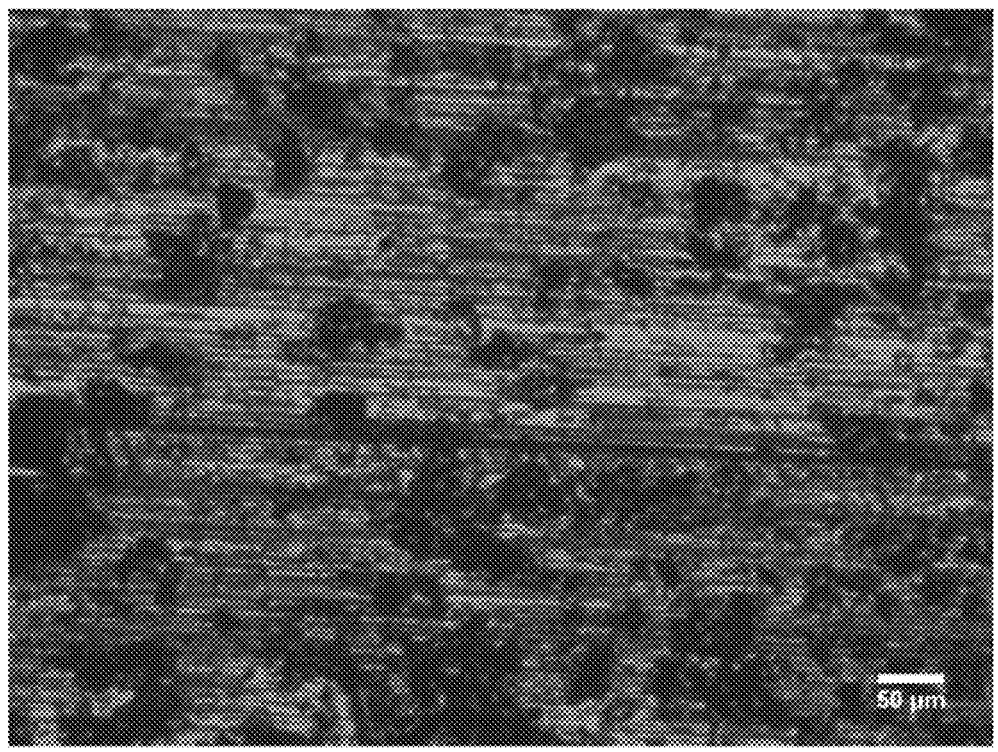
FIG. 8 is an optical micrograph of the as-machined surface of the $Fe_xCo_yB_{40}$ target of Example 5.
Figure 9:
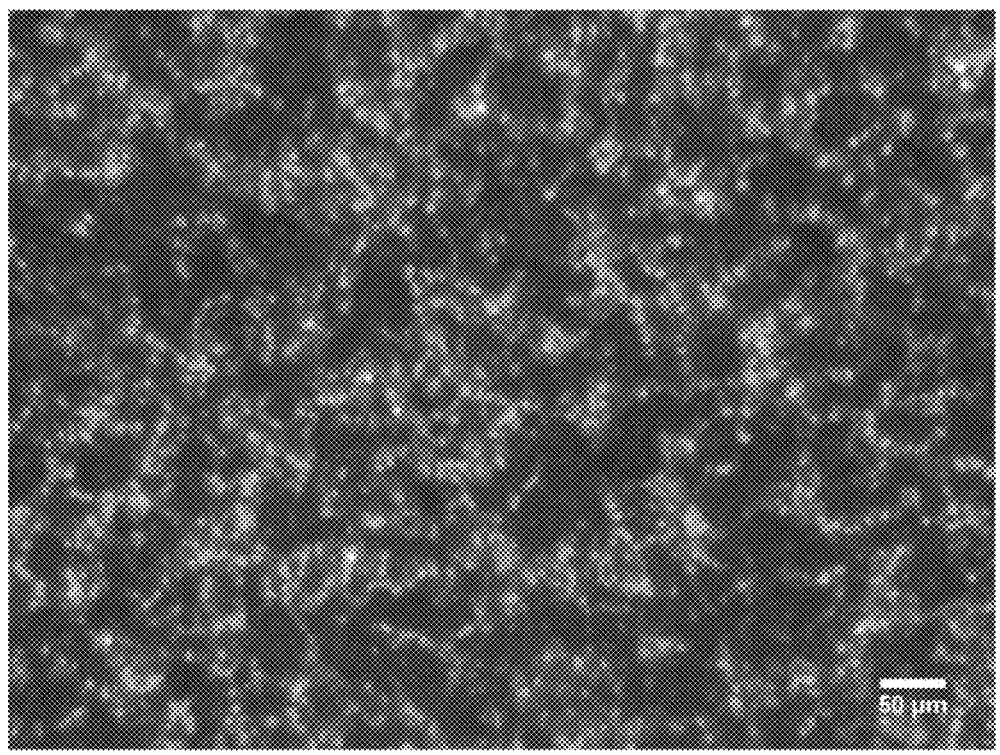
FIG. 9 is an optical micrograph of the target of FIG. 8 after the surface treatment of Example 5.

Sintered targets of $Fe_xCo_yB_{40}$ alloy were subjected to surface treatment. Optical microscopy was conducted on as-machined and full surface treated specimens to examine the effects of surface treatment on surface structure and cleanliness. The surface of the initial $Fe_xCo_yB_{40}$ target showed numerous machining-induced scratch lines, damage pits, and contaminations after machining, as seen in FIG. 8. After a full surface treatment including orbital sand polishing, dry ice blasting, and surface heating using a hot air gun, the machining-induced scratch lines were removed, contamination related to the entrapped dust or dirt could was eliminated, and a homogeneous microstructure on the target surface was achieved as illustrated in FIG. 9.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof.

The invention claimed is:

1. A method for finishing a surface of a sputtering target, comprising:
   blasting the surface of the sputtering target with spherical beads to remove machining defects and contaminants from the surface;
   wiping the surface of the sputtering target;
   dry ice blasting the surface of the sputtering target;
   hot air drying the surface of the sputtering target; and
   annealing the sputtering target to remove surface residual stress.

2. The method of claim 1, wherein the annealing is conducted with inert gas protection or under vacuum.

3. The method of claim 1, wherein the beads are made of zirconia, alumina, silica, or another metal oxide.

4. The method of claim 1, wherein the sputtering target comprises tantalum (Ta), iridium (Ir), cobalt (Co), ruthenium (Ru), tungsten (W), an iron-cobalt-boron alloy, or magnesium oxide, or an alloy selected from the group consisting of $Fe_xCo_yB_{10}$, $Fe_xCo_yB_{20}$, $Fe_xCo_yB_{30}$.

5. The method of claim 1, wherein the beads are blasted with a nozzle, and an angle between the blasting nozzle and the surface of the sputtering target is from about 5° to about 45°.

6. The method of claim 1, wherein the beads are blasted with a nozzle, and a distance between the blasting nozzle and the surface of the sputtering target is from about 5 mm to about 100 mm.

7. The method of claim 1, wherein the blasting is performed at a temperature of about 20° C. to about 35° C. with air or argon protection.

8. The method of claim 1, wherein the blasting is performed of a time period of about 0.05 to about 2.0 seconds/$cm^2$ of the surface of the sputtering target.

9. The method of claim 1, wherein the surface of the sputtering target is formed by grinding or lathing prior to the blasting with beads.

10. A method for finishing a sputtering target, comprising:
    bead blasting a surface of the sputtering target to polish the surface;
    wiping the surface of the sputtering target;
    dry ice blasting the surface of the sputtering target;
    hot air drying the surface of the sputtering target at a temperature of about 60° C. to about 120° C.; and
    annealing the sputtering target to remove surface residual stress; and
    wherein the sputtering target comprises ruthenium (Ru), an iron-cobalt-boron alloy, or magnesium oxide, or an alloy selected from the group consisting of $Fe_xCo_yB_{10}$, $Fe_xCo_yB_{20}$, $Fe_xCo_yB_{30}$.

11. The method of claim 1, wherein the beads have an average particle size of from about 10 microns to about 100 microns and wherein the blasting with beads is performed at a pressure of about 60 psi to about 100 psi.

* * * * *